United States Patent [19]

Levitt et al.

[11] Patent Number: 4,731,850
[45] Date of Patent: Mar. 15, 1988

[54] PROGRAMMABLE DIGITAL HEARING AID SYSTEM

[75] Inventors: Harry Levitt, Livingston, N.J.;
Richard S. Dugot, New York, N.Y.;
Kenneth W. Kopper, River Edge, N.J.

[73] Assignee: Audimax, Inc., Hackensack, N.J.

[21] Appl. No.: 879,214

[22] Filed: Jun. 26, 1986

[51] Int. Cl.$^4$ .................................. H04B 15/00
[52] U.S. Cl. ................................. 381/68.2; 381/68.4; 381/94
[58] Field of Search ................. 381/68.2, 68.4, 93, 381/94

[56] References Cited

U.S. PATENT DOCUMENTS

| | | | |
|---|---|---|---|
| 4,187,413 | 2/1980 | Moser | 381/68 |
| 4,425,481 | 1/1984 | Mansgold | 381/68.2 |
| 4,489,610 | 12/1984 | Slavin | 381/68 |
| 4,548,082 | 10/1985 | Engebretson et al. | 381/68 |
| 4,596,902 | 6/1986 | Gilman | 381/68.2 |
| 4,628,529 | 12/1986 | Borth | 381/68.2 |
| 4,630,305 | 12/1986 | Borth | 381/68.2 |

OTHER PUBLICATIONS

"Computer Applications in Audiology and Rehabilitation of the Hearing Impaired", by Harry Levitt, Journal of Communication Disorders 13, (1980), pp. 471-481.
E. G. & G. Reticon Technical Note No. 105, "A Tapped Analog Delay for Sampled Data Signal Processing", pp. 7-15-7-17, 7-25 and 7-26.

*Primary Examiner*—Jin F. Ng
*Assistant Examiner*—L. C. Schroeder
*Attorney, Agent, or Firm*—Brumbaugh, Graves, Donohue & Raymond

[57] ABSTRACT

A hearing aid system comprises a hearing aid that is programmable so as to have optimum electro-acoustic characteristics for the patient and acoustic environment in which it is used. Selected optimum parameter values are programmed into an electronically erasable, programmable read only memory (EEPROM) which supplies coefficients to a programmable filter and amplitude limiter in the hearing aid so as to cause the hearing aid to adjust automatically to the optimum set of parameter values for the speech level, room reverberation, and type of background noise then obtaining. The programmable filter may be a digital equivalent of a tapped delay line in which each delayed sample is multiplied by a weighting coefficient and the sum of the weighted samples generates a desired electro-acoustic characteristic. Alternatively, the programmable filter may be a tapped analog delay line in which the sum of the weighted outputs of the taps generates the desired characteristics. Acoustical feedback is reduced by an electrical feedback path in the hearing aid which is matched in both amplitude and phase to the acoustic feedback path, the two feedback signals being subtracted so as to cancel each other.

19 Claims, 5 Drawing Figures

PROGRAMMABLE DIGITAL HEARING AID SYSTEM

This invention relates to hearing aids, and more particularly to hearing aids that are programmable so as to have suitable characteristics to compensate for the hearing deficiencies of a patient. More specifically, it relates to hearing aids of this character that are capable of automatically adjusting to optimum parameter values as operating conditions such as speech level, room reverberation and background noise change, and also for reducing acoustic feedback.

BACKGROUND OF THE INVENTION

Conventional hearing aids suffer from several shortcomings. It is difficult if not impossible with conventional hearing aids to provide a frequency-gain characteristic that is ideal for each individual user. The acoustic coupling between the hearing aid receiver and the eardrum also introduces changes in the frequency-gain characteristic that is usually deleterious to both speech intelligibility and overall sound quality. For many patients, the optimum frequency-gain characteristic varies as a function of the level of the speech signal reaching the hearing aid. In order to protect patients from uncomfortably or dangerously loud signals, it is also necessary to limit the maximum acoustic power output of the hearing aid in some way. The methods used to limit acoustic power output of hearing aids typically introduce deleterious distortions to the amplified speech signal.

Another common problem is that of acoustic feedback. Even in the best designed hearing aids, not all of the amplified acoustic signal is delivered to the eardrum. A small proportion of the amplified acoustic signal leaks back to the hearing aid microphone forming an acoustic feedback loop. If the gain of the hearing aid is sufficiently high, this acoustic feedback will cause a self-generating oscillation to occur, resulting in an unwanted and highly unpleasant whistling sound. These acoustic oscillations prevent the hearing aid from being used. Methods of acoustic feedback control that are typically used include a tighter acoustic seal between the earmold and the walls of the ear canal so as to reduce acoustic leakage, placing the microphone at some distance from the hearing aid receiver, e.g. on the opposite ear, or simply reducing the gain of the hearing aid. None of these methods provides a satisfactory solution for high-gain hearing aids.

One of the most common complaints of hearing aid users is that background noise is particularly damaging to the understanding of speech. Methods currently used to reduce background noise in hearing aids employ filtering techniques in which the frequency regions containing high noise levels are eliminated.

Another common problem is that of room reverberation produced by acoustic reflections off the walls, ceiling, floor, and other surfaces in a room. A small amount of reverberation is beneficial but too much reverberation will make a room sound hollow or echoic and will interfere with both the quality and the intelligibility of speech.

Systems have been proposed heretofore utilizing computers for testing the hearing of patients and generating programming for a programmable hearing aid, as disclosed in "Computer Application in Audiology and Rehabilitation of the Hearing Impaired" by Harry Levitt, Journal of Communication Disorders 13 (1980), pages 471-481, and in the U.S. Pat. Nos. 4,187,413 to Moser, 4,489,610 to Slavin, and 4,548,082 to Engebretson et al., for example. None of these systems, however, affords a satisfactory solution for the problems of acoustic feedback, background noise, room reverberation and changes in the optimum frequency-gain characteristic resulting from variations in the level of the speech signal reaching the hearing aid.

It is an object of the invention, accordingly, to provide a new and improved hearing aid system that is free of the above-noted deficiencies of the prior art.

Another object of the invention is to provide new and improved hearing aid apparatus of the above character which is capable of automatically adjusting to an optimum set of parameter values as the speech level and type of background noise change.

A further object of the invention is to provide new and improved hearing aid apparatus of the above character in which acoustic feedback is substantially reduced.

Still another object of the invention is to provide new and improved hearing aid apparatus that is capable of effective noise and reverberation suppression and acoustic feedback reduction while maintaining optimum hearing characteristics as the speech and noise levels vary.

SUMMARY OF THE INVENTION

A hearing aid system according to the invention comprises a hearing aid that is programmable so as to have optimum electro-acoustic characteristics for the patient and acoustic environment in which it is used. It also includes instrumentation for measuring relevant audiological characteristics of the patient, as well as techniques and instrumentation for programming the hearing aid to have selected characteristics to compensate for hearing deficiencies determined from the measurements made. Desirably, several sets of optimum hearing aid parameter values, specified in terms of both the amplitude and phase characteristics, are determined for the patient as a function of speech level, type of background noise, and room reverberation, both spectral and temporal characteristics of the noise being taken into account. The selected optimum parameter values are preferably programmed into an electronically erasable, programmable read only memory (EEPROM) which supplies coefficients to programmable filter and amplitude limiting means in the hearing aid so as to cause the hearing aid to adjust automatically to the optimum set of parameter values for the speech level, room reverberation, and type of background noise then obtaining.

In one form, the programmable filter may be a digital equivalent of a tapped delay line in which each delayed sample is multiplied by a weighting coefficient. The sum of the weighted samples generates the desired electroacoustic characteristics. Alternatively, the programmable filter may be a tapped analog delay line in which the sum of the weighted outputs of the taps generates the desired characteristics. An important advantage of the latter type of filter is that the power consumption is low and quasi-digital techniques can be used, i.e., the waveform is sampled at discrete intervals in time without analog-to-digital conversion.

Another form of filter uses a small number of delays in which the delayed output is multiplied by a coefficient and added to the filter input so as to achieve additional delays, a technique known as recursive filtering.

The invention also provides means for reducing acoustical feedback. In one embodiment, an electrical feedback path in the hearing aid is matched in both amplitude and phase to the acoustic feedback path and the two feedback signals are subtracted so as to cancel each other. In an alternative embodiment, a single filter in the forward path is used with a transmission characteristic equivalent to that of the filter in the forward path plus the electrical feedback path.

Environmental noise control is effected according to the invention by providing means for sensing the relative speech/noise content in the signals from the hearing aid microphone and generating binary words that are supplied to the programmable filter for selecting from a memory a set of delay line tap coefficients that are effective to impart to the filter the appropriate frequency response for the specific environmental noise condition then being detected.

According to the invention, reduction in both noise and reverberation is achieved by the use of two or more microphones. The output of each microphone is processed in both amplitude and phase such that the summed output of the microphones is analogous to the output of a frequency selective directional microphone.

DESCRIPTION OF THE PREFERRED EMBODIMENTS

For a better understanding of the invention, reference is made to the following detailed description of a representative embodiment taken in conjunction with the accompanying drawings, in which.

A hearing aid system according to the invention comprises generally a wearable, programmable hearing aid in which all operations are controlled by data stored in an erasable electrical programmable read only memory (EEPROM), and a host controller providing electrical signals and test sounds as necessary for measuring the residual hearing of a subject, establishing optimal hearing aid parameters for the subject (including the phase relationship between input and output) and generating control signals as necessary to program the EEPROM module to perform the desired operations in the hearing aid.

THE HOST CONTROLLER

Figure 1:
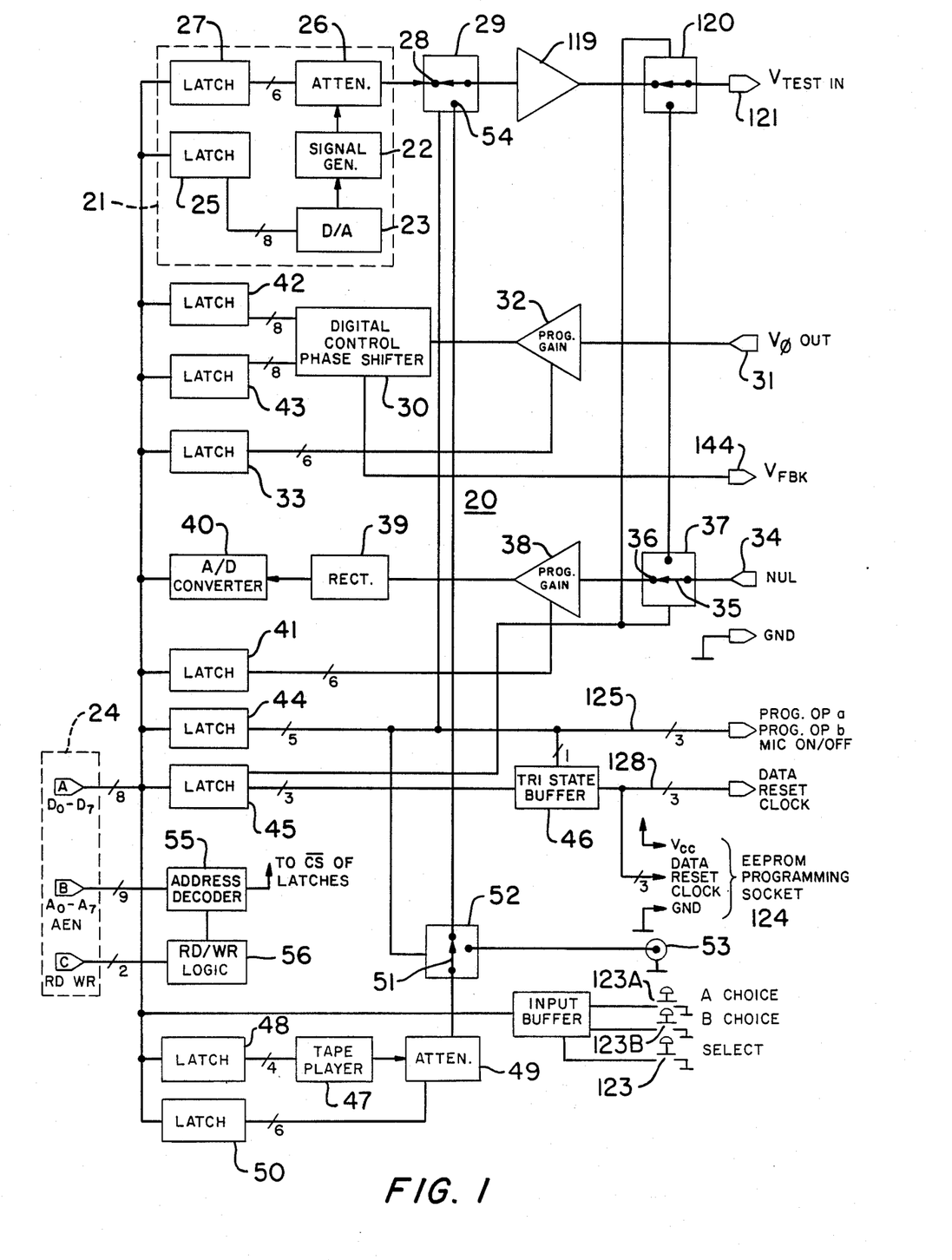
FIG. 1 illustrates schematically a host controller for use in prescribing a wearable, programmable hearing aid according to the invention.

Referring first to FIG. 1, the host controller 20 is shown as comprising an audiometric signal generator 21 including a signal generator 22, the frequency of which is controllable by a digital-to-analog (D/A) converter 23 controlled by a computer 24 through a latch 25. The output level of the signal generator is adapted to be adjusted by an attenuator 26 also controlled by the computer 24, through a latch 27. The output of the attenuator 26 is supplied to one terminal 28 of a switch 29, from which it can be transmitted through an amplifier 119 and a switch 120 to a terminal connector 121.

The host controller 20 also includes a phase measurement circuit comprising a digital phase shifter 30 which is adapted to receive the output voltage of the hearing aid through a connector 31 and a programmable gain amplifier 32, the gain of which is controllable by the computer 24 through the latch 33.

In adjusting a hearing aid for reduced feedback as described below, the input voltage developed by the hearing aid microphone in response to acoustic feedback alone when a test signal is supplied to the hearing aid is summed with an electrical feedback voltage supplied to the terminal 144 by the phase shifter 30. The summed acoustic and electrical feedback voltages from the hearing aid are supplied from the terminal 34 through the engaged movable and fixed contacts 35 and 36 of a switch 37, a programmable gain amplifier 38, a rectifier 39 and an analog to digital (A/D) converter 40 to the computer 24. In effecting the adjustment, the gain of the amplifier 32 and the phase shifter 30 are adjusted until a null output from the A/D converter 40 is read by the computer 24, indicating cancellation of the electrical and acoustic signals. The settings of the phase shifter 30 and the amplifier are then used to program an EEPROM in the hearing aid so as to cancel acoustic feedback.

The programmable gain amplifier 38 is controlled by the computer 24 through a latch 41, and the digital phase shifter 30 is also controlled by the computer 24 through the latches 42 and 43.

Additional components of the host controller 20 are programming logic comprising the latches 44 and 45 and a conventional tri-state buffer 46 which are activated in response to the computer 24 to provide the necessary signals to program the EEPROM and control the hearing aid during testing and programming, as described in greater detail below.

A conventional tape player 47 is also provided for generating various sound combinations for testing of a patient's hearing. The tape player 47 is controlled by the computer 24 through a latch 48 and its output level is adapted to be controlled by an attenuator 49, also controlled by the computer 24, through a latch 50. The output of the attenuator 49 is supplied to the movable contact 51 of a switch 52 which is controllable to supply the output either to a connector 53 to a sound field system, or to a fixed contact 54 on the switch 29 for supply to the hearing aid, as described in greater detail below. The switches 29 and 52 and the tri-state buffer 46 are adapted to be controlled by the computer 24 through the latch 44.

The respective latches 27, 25, 42, 43, 33, 40, 41, 44, 45, 48 and 50 are adapted to be controlled by the computer 24 through an address decoder 55 and Read/Write logic 56.

THE HEARING AID

Figure 2:
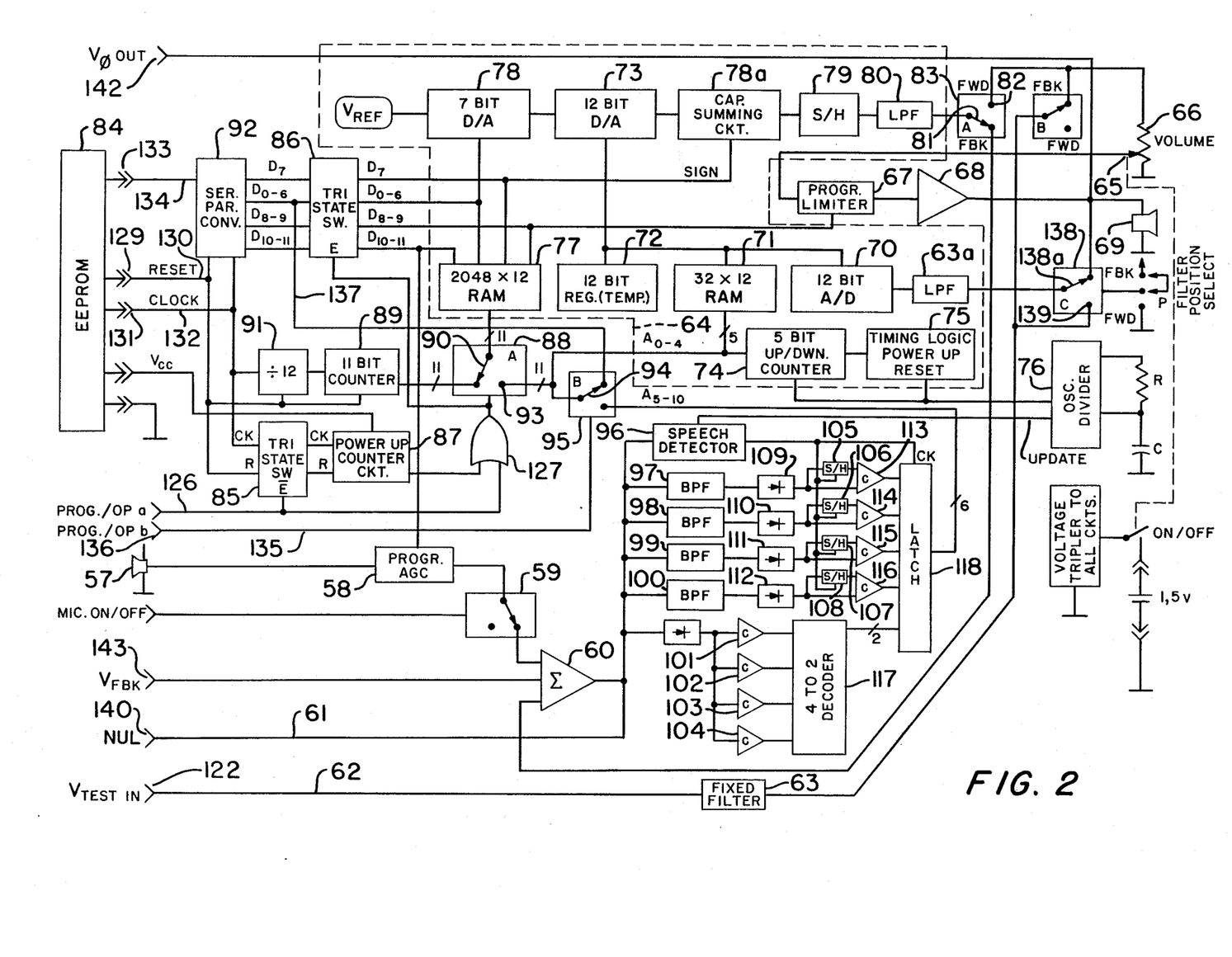
FIG. 2 illustrates schematically one form of programmable hearing aid according to the invention which utilizes a digital delay line filter.

Referring now to FIG. 2, a wearable hearing aid according to the invention comprises a microphone 57, the output of which is fed through a programmable automatic gain control (AGC) circuit 58 and a switch 59 to one terminal of summing amplifier 60. In normal operation, amplifier 60 supplies the signal through the conductors 61 and 62 and a filter 63 to a programmable filter 64 which is adapted to be programmed in the manner described below to produce optimum hearing aid characteristics for the patient based on the measurements made of the patient's residual hearing. The output of the programmable filter 64 is fed from the movable contact 65 of the volume control 66, through a programmable limiter 67, and an amplifier 68 to the hearing aid receiver 69.

The programmable filter 64 comprises essentially a digital tapped delay line including a 12 bit A/D converter 70, which supplies outputs to a 32×12 random access memory (RAM) 71, a 12 bit temporary register 72, and a 12 bit D/A converter 73. The signal supplied to the RAM 71 is sampled by a 5 bit up-down counter 74 controlled by timing logic 75 connected to receive clock signals from an oscillator divider 76 oscillating at a frequency at least twice the audio signal band width.

The characteristics of the programmable filter 64 are determined by coefficients stored in a random access memory (RAM) 77 which are selected and fed to a 7 bit D/A converter 78, the output of which is supplied to the D/A converter 73 for multiplication of the sampled data by a selected coefficient from the RAM 77. The output of the D/A converter 73 is summed in a conventional charge transfer summing circuit 78a and the sum signal is supplied through a sample and hold circuit 79 to a conventional anti-imaging filter 80. The output of the filter 80 is fed through the movable contact 81 of a switch 83 and a fixed contact 82 thereof to the volume control 66 and eventually to the receiver 69.

The coefficients stored in the RAM 77 when the hearing aid is in operation are provided essentially by an EEPROM 84 previously programmed by the host controller 20 (FIG. 1) as described in greater detail hereinafter. On power-up, the filter coefficients and limit parameters are transferred from the EEPROM 84 to the RAM 77 as follows: Tri-state switches 85 and 86 are enabled and power is supplied to the EEPROM 84 from a power-up control circuit 87. A switch 88 is now activated to connect an 11 bit counter 89 to the RAM 77 through the switch movable contact 90. The power-up control circuit 87 acting through the tri-state switch 85 supplies reset pulses to a divide-by-12 counter 91, to the 11 bit counter 89 and to a series parallel converter 92.

The power-up control circuit 87 also supplies clock pulses to the series parallel converter 92 and to the divide-by-12 counter 91 such that after every twelfth clock pulse, data is transferred from the EEPROM 84 through the series parallel converter 92 and the tri-state switch 86 to one of the memory locations in the RAM 77 as determined by the 11 bit counter 89. These steps are repeated as many times as are required to transfer all of the data stored in the EEPROM 84 to the RAM 77. When that occurs, the tri-state switch 86 is disabled and supplies a signal to the switch 88 to connect the movable contact 90 thereof to the fixed contact 93, which is connected to the movable contact 94 of a switch 95 and to the 5 bit counter 74 and the RAM 71. The hearing aid is then in its normal operating mode.

Automatic adjustment of the hearing aid to take into account environmental conditions such as changes in the speech level and type of background noise obtaining at any time is effected by environmental control means comprising a speech detector 96, four band pass filters 97, 98, 99 and 100, and a level detector including four differently prebiased comparators 101, 102, 103 and 104. Typical bandwidths for the filters 97, 98, 99 and 100 might be 100–750 Hz, 750–1500 Kz, 1500–3000 Hz, and 3000 to the upper frequency limit, respectively. The speech detector 96 is conventional and may include a level detector followed by a short term averaging device. For steady state noise, the output of the level detector will be relatively constant, indicating that noise only is present. Whenever fluctuations in level are within a prescribed bandwidth typical of speech, the short term average increases, indicating that speech is present. The speech detector 96 is clocked periodically by signals from the oscillator divider 76 to provide either a zero output indicative of noise or a one output indicative of speech periodically to each of a plurality of sample and hold circuits 105, 106, 107 and 108. The outputs of the band pass filters 97, 98, 99 and 100 are rectified in the rectifiers 109, 110, 111 and 112, respectively and fed to the sample and hold circuits 105–108, respectively, the outputs of which are fed to the comparators 113, 114, 115 and 116, respectively. The outputs of the rectifiers 109–112, respectively, are also supplied directly as inputs to the comparators 113–116, respectively.

So long as there is a one output from the speech detector 96 indicating the presence of speech in the input, the instantaneous outputs of each of the band pass filters 97–100 are compared with previous values held in the sample and hold circuits 105–108, causing the comparators 113–116, respectively, to generate a binary coefficient (0,1) indicating whether or not the speech level in the associated band pass filter exceeds the noise level. At the same time, a level detector 117 responsive to the respective outputs of the comparators 101–104 generates a two bit coefficient indicating the average signal level.

The outputs of the comparators 113–116, inclusive, and of the input level detector 117 are fed to latching means 118, which provides a six bit output that is adapted to be transmitted through the switches 95 and 88 to the RAM 77. Whenever the output of the speech detector 96 indicates that speech is present, the binary outputs of the four filter level comparators 113–116, inclusive, and that of the average level detector 117 are transmitted to the RAM 77 through the control switches 95 and 88. These binary words are updated at regular intervals at a clock rate determined by the oscillator divider 76, as stated. Each of the sixty-four possible combinations of the 6 bit binary words identifies a different frequency response for the programmable filter, and a corresponding set of coefficients stored in the RAM 77 is selected, thereby automatically adjusting the hearing aid to the optimum set of parameter values as the speech level and type of background noise change.

In prescribing hearing aids with the use of the host controller, the subject is seated in a quiet room with the hearing aid inserted in his ear. The hearing aid is connected to the host controller by an electrical cable (not shown), thereby placing it directly under the control of the host controller. The prescriptive procedure usually consists of five stages:

(1) measurement of the subject's residual hearing;
(2) derivation of an appropriate set of electroacoustic characteristics of the hearing aid from such measurements, and programming the hearing aid accordingly;
(3) measuring acoustic feedback in the hearing aid;
(4) re-programming the hearing aid to minimize acoustic feedback; and (5) paired comparison testing of possible alternative settings of the hearing aid to determine the optimal hearing aid settings for the subject.

The subject's residual hearing is measured using signals generated by the audiometric section 21 in the host controller 20 (FIG. 1). These signals are delivered to the hearing aid via the switch 29, an amplifier 119, a switch 120, a connector 121, a connector 122 in the hearing aid, and the conductor 62. The signals are processed by the digital programming filter and associated circuitry in the hearing aid and are delivered to the subject's ear using the hearing aid receiver and associated coupling that the subject will actually wear after the hearing aid is prescribed. This procedure eliminates the need for any corrections in going from headphone to sound field measurements. The measurements are usually obtained with narrow band stimuli (tones, warble tones, or narrow band noise) and include threshold of hearing, various loudness levels (comfortable, loud) and loudness discomfort level.

The measurements obtained on the patient's residual hearing are used in deriving the electroacoustic characteristics of the hearing aid. The measurements of loudness discomfort level are used to program the limiter 67 so that sounds amplified by the hearing aid never exceed the patient's loudness discomfort level. The measurements of auditory threshold, most comfortable loudness level, and loudness discomfort level are used to determine the frequency gain characteristics of the hearing aid.

Figure 3:
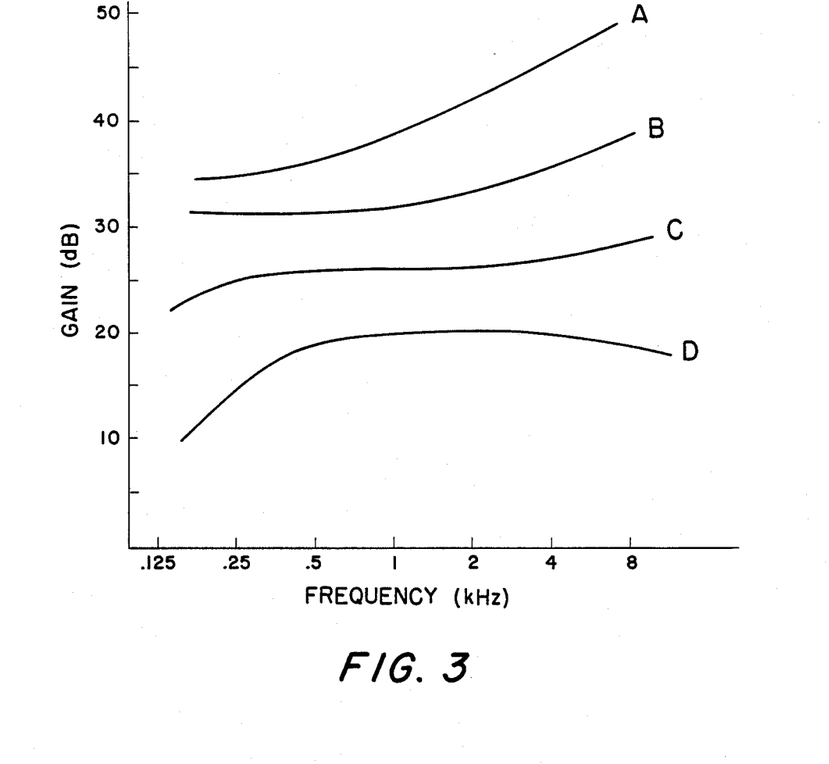
FIG. 3 shows a set of optimum frequency-gain characteristics appropriate for different speech levels for a typical hearing impaired subject.

FIG. 3 shows four frequency-gain characteristics for a typical patient. Curve A is used when the speech signal reaching the hearing aid is relatively low, as would occur when somebody speaks in a very soft voice. Under these conditions the hearing aid provides a large amount of gain, particularly in the high frequencies. This is done to ensure that the speech spectrum is placed above the patient's threshold of hearing at all frequencies.

Curve B is used when the incoming speech signal is at the low end of the comfortable loudness range for a normal hearing person. The amplification provided places the speech spectrum at the bottom of the patient's most comfortable loudness range at all frequencies.

Curve C is used when the level of the incoming speech is moderately loud for a normal hearing person. The amplification provided places the speech spectrum at the top of the patient's most comfortable loudness range for all but the lowest frequencies. Less gain is provided at the low frequencies to reduce upward spread of masking effects; e.g., weak high-frequency sounds being masked by intense low frequency sounds.

Curve D is used when the signals reaching the hearing aid are very loud for a normal hearing person. Under these conditions the hearing aid provides relatively little gain with a significant roll off in the low frequency region in order to substantially reduce upward spread of masking effects.

A set of coefficients is derived for each of these frequency gain characteristics. These coefficients are derived using procedures that are well known in the field of digital signal filtering and are used to program filter 64 so that the hearing aid produces the required frequency-gain characteristic. The filter coefficients are stored in the RAM 77.

The level of the incoming speech signal is determined by the level detectors 101, 102, 103 and 104. The decoder 117 generates a binary word depending on the outputs of these level detectors. This binary word is transmitted to the RAM 77, in order to select the appropriate set of filter coefficients. If the signal reaching the hearing aid consists of speech plus noise, as determined by the speech detector 96, then alternative frequency-gain characteristics are used. These frequency-gain characteristics are derived by first determining the incoming signal level, as described above, selecting an appropriate frequency-gain characteristic and then reducing the gain in those frequency regions where the background noise level exceeds the speech level. This is determined by comparing the output levels of the bandpass filters 97, 98, 99, and 100 when speech is present to the corresponding levels measured when noise only is present. The latter information is stored in the sample and hold units 105, 106, 107 and 108. The comparisons are done by means of the comparators 113, 114, 115, and 116. The outputs of these comparators in combination with the outputs of the level decoder, 117, generate a 6-bit word that selects the appropriate set of filter coefficients in the RAM 77.

For patient hearing parameter selection and programming, the hearing aid is interfaced with the host controller as described above, and the EEPROM 84 (FIG. 2) is plugged into a programming slot 124 in the host controller 20. A conductor in the line 125 (FIG. 1) is set to logic 1 by operation of the computer 24 which applies a logic 1 signal to the line 126 (FIG. 2), resulting in the tri-state switch 85 being disabled and the switch 88 being activated by an OR gate 127 to move the switch movable contact 90 to connect the counter 89 to the RAM 77. The host controller 20 generates reset pulses which are transmitted over a conductor in the line 128 (FIG. 1) through the connector 129 and the line 130 in the hearing aid (FIG. 2) to reset the counters 91 and 89 and the series-to-parallel converter 92.

Clock signals are fed from the host controller 20 over another conductor in the line 128 through a connector 131 and a conductor 132 in the hearing aid to the serial-to-parallel converter 92 and are divided by 12 in the counter 91, the output of which is fed through the switch 88 to the RAM 77. Synchronously with the clock signals on the line 132, data are fed from a conductor in the line 128 in the host controller 20 and through a connector 133 and a conductor 134 in the hearing aid to the serial-to-parallel converter 92. After every twelfth clock signal, data is transferred from the serial-to-parallel converter 92 through the tri-state switch 86 to one of the memory locations in the RAM 77 determined by the counter 89. This step may be repeated as many times as required to store essential data in the RAM 77 within the storage limits of the latter. The line 126 is then set to logic 0 by operation of the computer 24 through a conductor in the line 125, thus disabling the tristate switch 86 and actuating the switch 88 to cause the movable contact 90 thereof to move into engagement with the fixed contact 93 resulting in the connection of the RAM 77 to the counter 74 and to the RAM 71. The hearing aid is now ready for patient hearing parameter selection and programming.

The selection of the desired hearing aid parameters is accomplished by actuating the computer 24 to set the line 135 in the hearing aid (FIG. 2) to logic 1 through a conductor in the cable 128 and a connector 136 on the hearing aid. This activates the switch 95 and supplies data in the form of 6 bit words from the series-to-parallel converter 92 over the line 137 through the movable contact 94 of the switch 95 and the movable contact 90 of the switch 88 to the RAM 77. The series-to-parallel converter 92 is reset by a signal from the computer 24 (FIG. 1) transmitted through a conductor in the line 128 and the connector 129 and conductor 130 in the hearing aid, and a 6 bit word is fed into the converter 92 and placed on seven of the address lines of the RAM 77, selecting one of sixty-four possible sets of coefficients for use in the programmable filter in the hearing aid. The selection proceeds in the like fashion throughout the process of frequency shaping of the filter.

Feedback cancellation is achieved in the hearing aid by first measuring the acoustic feed back in situ and then creating an electronic feedback path with identical amplitude and phase characteristics. The outputs of the two feedback paths are then subtracted, thereby canceling any feedback signals that might occur.

Acoustic feedback is measured with the hearing aid in the ear as it would normally be worn. An electrical test signal is applied to the terminal 122 (FIG. 2) from the host controller 20. A portion of this amplified acoustic signal will leak through the ear mold and reach the microphone 57, which will then convert the signal back to electrical form and return it to the hearing aid amplifier. Feedback will occur if the total gain in the loop, i.e., from the input to the filter 63 through the filter and amplifier of the hearing aid to the output transducer 69 and from the microphone 57 back to the input to the filter 63, exceeds unity.

For the purpose of this measurement, the feedback loop is broken between 140 and 122. Terminal 140 of the hearing aid is then connected to terminal 34 of the host controller, terminal 142 of the hearing aid is connected to terminal 31 of the host controller, and terminal 143 of the hearing aid is connected to terminal 144 of the host controller. The programmable phase shifter 30 and programmable amplifier 32 are then adjusted by the computer 24 so as to minimize the sum of the acoustic and electrical feedback signals of the output of summing amplifier 60.

From the settings obtained with the phase shifter 30 and amplifier 32 at cancellation (at the "null"), the host controller calculates a set of coefficients for a programmable filter to be inserted in the electrical feedback path between terminals 142 and 143 so as to cancel the acoustic feedback.

If desired, the additional programmable filter in the feedback path of the hearing aid can be eliminated by calculating the effective gain of both the forward and feedback paths and modifying the programmable filter 64 so as to include this additional gain. This implementation necessarily requires an adjustment to both the amplitude and phase characteristics of the filter 64. Alternatively, filter 64 can be placed in the feedback path with appropriate changes in the coefficients.

The setting of the hearing aid is then checked using a paired comparison technique to determine if optimum frequency response characteristics for the patient have been obtained. This involves the provision in the host controller of one or more additional programmable filters adjusted to have frequency responses that differ systematically from that prescribed using the above procedure. In the practice of this technique, the patient compares the prescribed hearing aid against an alternative hearing aid by replacing the prescribed filter and limiter with components having alternative electroacoustic characteristics by actuation of a select switch 123 in the host controller 20. The patient listens to speech through the hearing aid, switching back and forth two sets of electroacoustic characteristics at will by means of the switches 123A and 123B, choosing the characteristic which is more intelligible or preferable in some way. Paired comparisons made in this manner may be repeated with systematic deviations from the prescribed frequency response in order to determine whether another frequency response would be more intelligible or preferable. If a better response is found, the paired comparison procedure may be repeated iteratively until the optimum set of electroacoustic characteristics is found. Adaptive strategies for finding the optimum electro-acoustic characteristics are described in Levitt et al., Journal of Rehabilitation Research and Development, Vol. 23, No. 1, 1986, pages 79–87.

In normal operation, the EEPROM 84, with the optimum coefficients determined as described above stored therein, is plugged into the hearing aid, and when power is turned on the coefficients are transferred from the EEPROM 84 into the RAM 77. From then on the EEPROM is inactive in order to save power. The operating sequence is as follows: On power-up the tri-state switches 85 and 86 are enabled, power is supplied to the EEPROM 84 from the power-up control circuit 87, and the switch 88 is activated to connect the counter 89 to the RAM 77. The power-up circuit control 87 supplies reset pulses to the counters 89 and 91 and to the series-to-parallel converter 92, and clock pulses to the counter 91, the converter 92 and the EEPROM 84. After every twelfth clock pulse, data is transferred from the series-to-parallel converter 92 through the tri-state switch 86 to one of the memory locations in the RAM 77 determined by the counter 89. This step is repeated until all the data stored in the EEPROM 84 have been transferred to the RAM 77. The tri-state switch 86 is then disabled and the switch 88 is connected to the switch 37, the counter 74 and the RAM 71.

The hearing aid is now in its normal operating mode and speech detected by the microphone 57 is amplified in the programmable automatic gain control circuit 58 and transmitted through the amplifier 60, the filter 63 and the low pass filter 63a into the programmable filter circuitry.

A so-called "bucket brigade" analog delay line may be used as a programmable filter instead of the digital delay line described above, as shown in FIG. 4. Thus, the audio signal may be fed from the filter 63a through a compressor 145 to a delay line 146 having, say, thirty-two taps therealong. The delay line 146 is clocked by a 50% duty cycle signal at a frequency equal to at least twice the audio signal bandwidth. During the logic "1" period of the clock, the audio signal is supplied into the next stage of the analog delay line. On the falling edge of the clock signal, the analog signal is held in the next stage. During the logic "0" period of the clock, an analog multiplexer 147 selects one of the thirty-two taps of the delay line and feeds the signal therefrom into the input of a 7 bit D/A converter 148. The signal is divided down in a resistance ladder in the converter 148 as determined by a 7 bit word from the RAM 77, the address of which is specified by the counter 89.

Figure 4:
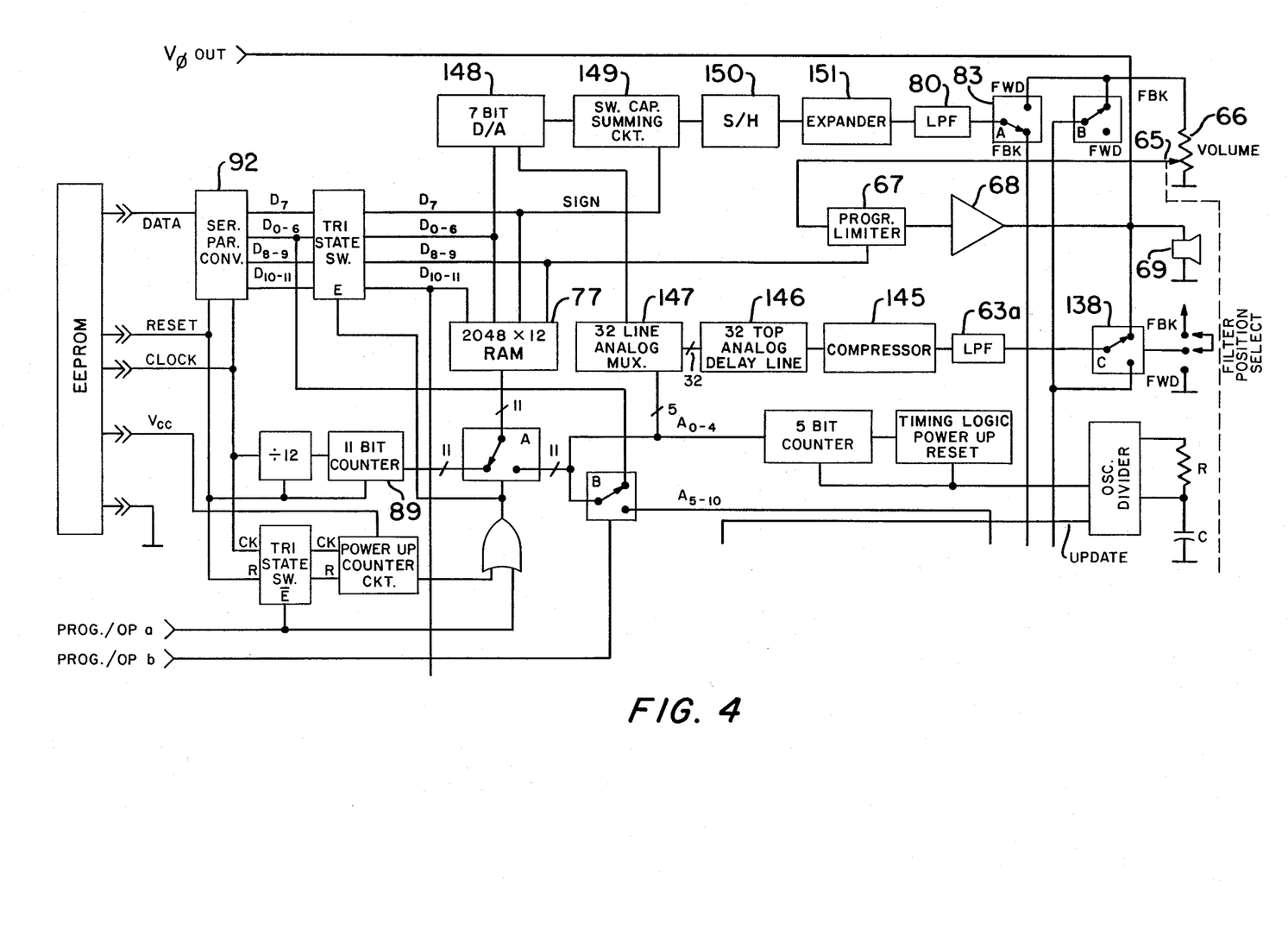
FIG. 4 is a partial schematic diagram of the hearing aid shown in FIG. 2, modified to utilize an analog delay line filter.

The divided down voltage is then given a plus or minus sign as determined by a bit from the series-parallel converter 92 and is fed to a switched capacitor summing circuit 149. The analog multiplexer 147 proceeds to the next tap and repeats the process just described for a total of thirty-two times. The thirty-two voltages thus derived are summed in the summing circuit 149 and transferred to a sample and hold circuit 150, the output of which is expanded in an expander 151 and supplied through the filter 80 to the hearing aid receiver 69.

An analog tapped delay line in which the delays are achieved acoustically might also be employed in a programmable hearing aid filter according to the invention, instead of the digital and analog delay lines described above. This might be accomplished by feeding the hearing aid electrical signals to a transducer to generate sound to travel along a tube of appropriate length and having taps in the form of miniature microphones disposed along the tube. The signals at the taps would be multiplied by selected predetermined coefficients and added to produce a resultant characteristic much in the same manner as described above.

Figure 5:
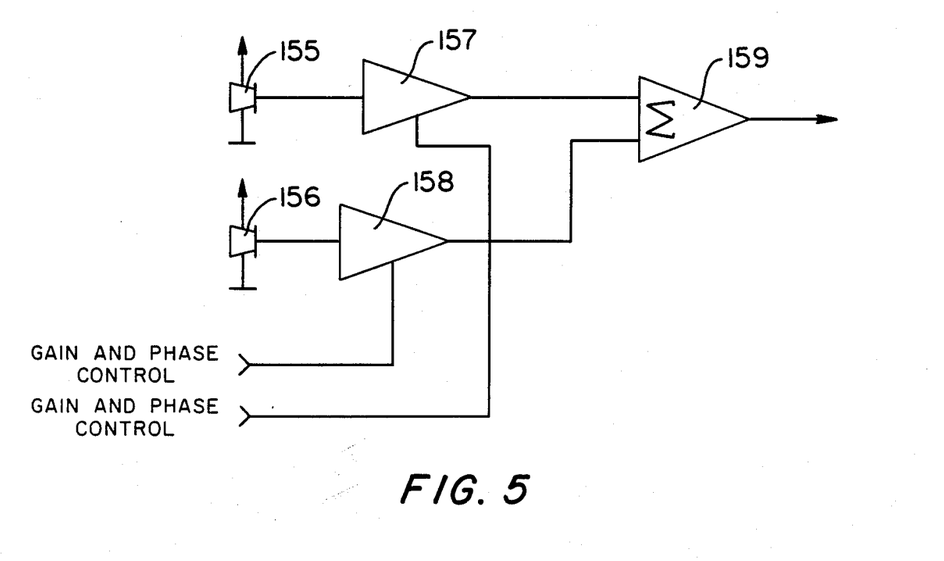
FIG. 5 shows schematically how multiple microphones can be used according to the invention to reduce both noise and reverberation.

By using an array of two or more microphones on the body (e.g., along the frame of a pair of spectacles), the weighting coefficients can be chosen in the manner described above such that the weighted summed output of the microphones, with an appropriate phase shift, is equivalent to the output of a frequency selective directional microphone. This will reduce the effects of both noise and room reverberation. A typical configuration is shown in FIG. 5 as comprising the microphones 155 and 156 supplying inputs to amplifiers 157 and 158, the gain and phase characteristics of each of which is programmable from the RAM 77 in the hearing aid. The outputs of the programmable gain amplifiers 157 and 158 are summed in a summing amplifier 159, the output of which would be supplied to the programmable AGC device 58.

Automatic adjustment of the frequency response of the hearing aid as a function of speech level may also be effected by placing the programmable filter in a feedback loop in series with a programmable compression amplifier. Since the degree of feedback depends on signal level, the overall frequency response also depends on signal level.

The components shown in FIGS. 2, 4 and 5 may be incorporated in the hearing aid or part may be contained in a pocket size case to be carried in the clothing of the person wearing the hearing aid. In the latter case, the components contained in the case may be coupled to the components in the hearing aid by a conventional FM transmission link, for example.

The invention thus provides a novel and highly effective hearing aid system for use by hearing impaired patients. By utilizing a digital or analog delay line as a programmable filter in a hearing aid, it is possible to establish optimal hearing aid parameters for the patient. Moreover, by virtue of the novel means employed for effecting automatic adjustment of the programmable filter to optimum parameter values as the speech level, room reverberation and type of background noise change and for reducing acoustic feedback, a superior hearing aid system of optimum characteristics can be prescribed for hearing deficient patients.

The several embodiments described above and depicted in the drawings are intended to be only illustrative, and modifications in form and detail are possible within the scope of the following claims. For example, more than four bandwidth filters and different frequency bands might be employed. Also, the number of taps on the digital filter may be greater than 32 as in the specific embodiment described above and the A/D converter may, of course have more than 12 bit resolution.

We claim:

1. A hearing aid comprising at least one input microphone, an output receiver, and a signal transmission channel interposed between said microphone and said receiver in which the improvement comprises a programmable delay line filter and programmable signal limiter means interposed between the input and output of said transmission channel in a feedback path for said transmission channel, said filter being programmed to impart to the hearing aid at least one response characteristic effective to compensate for impaired hearing of the wearer of the aid.

2. A hearing aid as in claim 1 in which said filter comprises a delay line having a multiplicity of taps, first memory means for storing filter-response related coefficients therein, and means jointly responsive to said delay line taps and to coefficients stored in said memory means for providing an output having at least one response characteristic effective to compensate for impaired hearing of the wearer of the aid.

3. A hearing aid as in claim 2 in which said filter comprises a digital delay line and means for converting analog signals in said channel to digital signals for application to said delay line.

4. A hearing aid as in claim 2 in which said filter comprises an analog delay line having a multiplicity of taps, and means for periodically sampling analog signals in said channel and supplying them to said delay line.

5. A hearing aid comprising at least one input microphone, an output receiver, and a transmission channel interposed between said microphone and receiver, means controllable to impart different response characteristics to said hearing aid, and controlling means responsive to the level of speech signals in said transmission channel in excess of the level of noise signals in said channel for automatically controlling said controllable means to impart a selected one of said different response characteristics to said hearing aid.

6. A hearing aid as described in claim 5 in which said controlling means comprises speech detector means for determining when speech signals are in said transmission channel, a plurality of bandpass filter means for determining the noise frequency spectrum in said transmission channel, a plurality of comparator means each response to said speech detector and to respective bandpass filter means for indicating whether the speech level in each said bandpass filter exceeds the noise level therein and for actuating said controlling means to impart to the hearing aid a response characteristic effective to compensate for impaired hearing of the wearer of the aid at the noise levels obtaining in said channel.

7. A hearing aid as described in claim 6 in which said controlling means also comprises means for rectifying a portion of the signals in said transmission channel, a plurality of differently pre-biased comparators connected to receive the output of said rectifying means, and means responsive to the outputs of said comparators for generating a signal representative of the average level of the signals in said transmission channel for controlling said controllable means to impart to the hearing aid a response characteristic effective to compensate for impaired hearing of the wearer of the aid at the signal and noise levels obtaining in said channel.

8. A hearing aid as described in claim 7 in which said controllable means comprises a delay line having a multiplicity of taps, memory means for storing predetermined filter response-related coefficients therein, and means responsive to said controlling means for combining said delay line taps and coefficients to constitute a delay line filter of predetermined response characteristic in said transmission channel.

9. A hearing aid comprising at least one input microphone, an output receiver, a signal transmission channel interposed between said microphone and said receiver, and a programmable delay line filter interposed in a forward path between the input and output of said transmission channel, said programmable filter being programmed to effect substantial reduction of acoustic feedback from said receiver to said microphone.

10. A hearing aid as described in claim 1 in which said programmable delay line filter is programmed so as to effect substantial reduction of acoustic feedback from said receiver to said microphone.

11. A hearing aid comprising at least one input microphone, an output receiver, a signal transmission channel interposed between said microphone and said receiver, and a programmable delay line filter interposed in a forward path between the input and output of said transmission channel said filter comprising a digital delay line having a multiplicity of taps, means for converting analog signals in said channel to digital signals for application to said delay line, and first memory means for storing filter-response related coefficients therein, said digital delay line comprising second memory means arranged to receive digital signals from said analog-to-digital converting means, register means connected to receive digital signals from said second memory means, first digital-to-analog converter means connected to receive digital signals from said register means, timing means controlling the transfer of digital signals from said second memory means through said register means to said first digital-to-analog converter means, second digital-to-analog converter means connected to receive filter response related coefficients from said memory means in timed relation to the transfer of digital signals to said first digital-to-analog converter means and to supply analog signals therefrom to said first digital-to-analog converter means for combination therein with digital signals transferred thereto from said second memory means, signal summing means connected to receive the output of said first digital converter means, and sample and hold means connected to receive the output of said signal summing means and for providing an output having at least one response characteristic effective to compensate for impaired hearing of the wearer of the aid.

12. A hearing aid comprising at least one input microphone, an output receiver, a signal transmission channel interposed between said microphone and said receiver, and a programmable delay line filter interposed in a forward path between the input and output of aid transmission channel, said filter comprising an analog delay line having a multiplicity of taps, means for periodically sampling analog signals in said channel and sampling analog signals in said channel and supplying them to said delay line, and first memory means for storing filter-response related coeffients therein, digital-to-analog converter means connected to receive filter-response related coefficients from said first memory means for conversion to analog values, multiplexer means connected to supply signal samples from said sampling means to said digital converter means for combination with said respective analog values, summing means for summing said analog values and signal samples, and sample and hold means connected to receive the output of said summing means and for providing an output having at least one response characteristic effective to compensate for impaired hearing of the wearer of the aid.

13. A method of reducing acoustic feedback in a sound system comprising a microphone, a transducer and a signal transmission channel interposed between said microphone and transducer, comprising the steps of determining the effect on the amplitude and phase of a signal in said transmission channel as a function of frequency of acoustic feedback between said transducer and microphone, and inserting between the input and output of said transmission channel an electrical feedback path having a filter therein programmed to equalize and reduce the effect of said acoustic feedback both in amplitude and phase on a signal in said transmission channel.

14. A method of reducing acoustic feedback in a hearing aid comprising a microphone, a receiver fitted in an ear of a wearer of the aid, and a signal transmission channel interposed between said microphone and transducer, comprising the steps of determining the effect on the amplitude and phase of a signal in said transmission channel as a function of frequency of acoustic feedback between said receiver and microphone, and inserting between the input and output of said transmission channel a programmable filter programmed to equalize and reduce the effect of said acoustic feedback both in amplitude and phase on a signal in said transmission channel.

15. A method of reducing feedback in a hearing aid as described in claim 14 in which said programmable filter is inserted in a forward path through said transmission channel.

16. A method of reducing feedback in a hearing aid as described in claim 14 in which said programmable filter is inserted in an electrical feedback loop for said transmission channel.

17. A hearing aid comprising at least two input microphone channels, means for adjusting the amplitude and phase characteristics of each of said microphone channels, means for summing the outputs of said microphone channels, an output receiver, a signal transmission channel connected to receive the output of said summing means and to provide an output to said receiver, and a programmable filter interposed between said summing means and the output of said transmission channel, said filter being programmed to impart to the hearing aid at least one response characteristic effective to compensate for impaired hearing of the wearer of the aid and to reduce the effects of both noise and reverberation.

18. A hearing aid comprising at least one input microphone, an output receiver, and a signal transmission channel interposed between said microphone and said receiver in which the improvement comprises a signal-level dependent amplifier interposed between the input and output of said transmission channel in a feedback path for said transmission channel, said amplifier being programmed to impart to the hearing aid at least one response characteristic effective to compensate for impaired hearing of the wearer of the aid.

19. A hearing aid comprising at least one input microphone, an output receiver, a signal transmission channel interposed between said microphone and said receiver, and a programmable delay line filter interposed in a feedback path between the input and output of said transmission channel, said programmable filter being programmed to effect substantial reduction of acoustic feedback from said receiver to said microphone.

* * * * *

UNITED STATES PATENT AND TRADEMARK OFFICE
CERTIFICATE OF CORRECTION

PATENT NO. : 4,731,850
DATED : March 15, 1988
INVENTOR(S) : LEVITT ET AL.

It is certified that error appears in the above-identified patent and that said Letters Patent is hereby corrected as shown below:

Col. 5, line 68, "1500 Kz" should read --1500 Hz--; Col. 12, line 44, "response" should read --responsive--; Col. 13, line 52, "aid" should read --said--; Col. 13, line 58, "coeffients" should read --coefficients--.

Signed and Sealed this

Third Day of October, 1989

Attest:

DONALD J. QUIGG

Attesting Officer

Commissioner of Patents and Trademarks